US009443983B2

(12) United States Patent
Sun et al.

(10) Patent No.: US 9,443,983 B2
(45) Date of Patent: Sep. 13, 2016

(54) PIXEL UNIT, ARRAY SUBSTRATE AND MANUFACTURING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jian Sun, Beijing (CN); Dong Lei, Beijing (CN); Seongjun An, Beijing (CN); Bongyeol Ryu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/422,414

(22) PCT Filed: May 27, 2014

(86) PCT No.: PCT/CN2014/078505
§ 371 (c)(1),
(2) Date: Feb. 19, 2015

(87) PCT Pub. No.: WO2015/085719
PCT Pub. Date: Jun. 18, 2015

(65) Prior Publication Data
US 2016/0013326 A1 Jan. 14, 2016

(30) Foreign Application Priority Data
Dec. 13, 2013 (CN) .......................... 2013 1 0684773

(51) Int. Cl.
H01L 29/12 (2006.01)
H01L 29/786 (2006.01)
(Continued)

(52) U.S. Cl.
CPC ....... *H01L 29/78675* (2013.01); *G02F 1/1368* (2013.01); *H01L 27/124* (2013.01); *H01L 27/1222* (2013.01); *H01L 27/1255* (2013.01); *H01L 27/1259* (2013.01)

(58) Field of Classification Search
CPC .......................... H01L 27/12; H01L 27/1214
USPC .............. 257/149, 151–152, 171; 438/71, 49
See application file for complete search history.

(56) References Cited

U.S. PATENT DOCUMENTS 7,504,091 B2 * 3/2009 Franklin .............. A61K 8/0229
424/401

(Continued)

FOREIGN PATENT DOCUMENTS

CN 101075051 A 11/2007
CN 102709236 A 10/2012
(Continued)

OTHER PUBLICATIONS

"Integrated" Merriam-Webster Online Dictionary. 2007, http://www.merriam-webster.com (May 10, 2016).*
(Continued)

*Primary Examiner* — Jami M Valentine
(74) *Attorney, Agent, or Firm* — Nath, Goldberg & Meyer; Joshua B. Goldberg; Stanley N. Protigal

(57) ABSTRACT

A pixel unit comprising a thin film transistor, a pixel electrode and a common electrode is provided. The common electrode and the pixel electrode form a capacitor. The pixel electrode is integrated with a drain of the thin film transistor. An array substrate comprising the pixel unit, a manufacturing method of the array substrate and a display device comprising the array substrate are also provided. In the pixel unit provided by the present invention, since the pixel electrode is integrated with the drain of the thin film transistor, it is not required to provide connection vias, so the manufacturing cost of an array substrate comprising the pixel unit is reduced.

20 Claims, 3 Drawing Sheets

(51) Int. Cl.
    *G02F 1/1368*    (2006.01)
    *H01L 27/12*    (2006.01)

(56) References Cited

U.S. PATENT DOCUMENTS

| 8,502,944 | B2* | 8/2013 | Ahn | G02F 1/134363 |
| | | | | 349/141 |
| 2005/0140841 | A1 | 6/2005 | Yang et al. | |
| 2008/0035920 | A1 | 2/2008 | Takechi et al. | |
| 2008/0113475 | A1* | 5/2008 | Kim | G02F 1/136213 |
| | | | | 438/151 |
| 2009/0096949 | A1 | 4/2009 | Cho et al. | |
| 2011/0303921 | A1* | 12/2011 | Shin | H01L 27/3244 |
| | | | | 257/71 |
| 2012/0153911 | A1* | 6/2012 | Eccher | H02M 3/156 |
| | | | | 323/282 |

FOREIGN PATENT DOCUMENTS

| CN | 103227147 A | 7/2013 |
| CN | 103698955 A | 4/2014 |

OTHER PUBLICATIONS

"Integrate" Merriam-Webster Online Dictionary. 2007, http://www.merriam-webster.com (May 10, 2016).*

International Search Report dated May 27, 2014 corresponding to application No. PCT/CN2014/078505.

Chinese Office Action dated Oct. 10, 2015 issued in corresponding Chinese Application No. 201310684773.1.

English translation of Written Opinion of the International Searching Authority originally filed with IDS dated Feb. 19, 2015.

* cited by examiner

PIXEL UNIT, ARRAY SUBSTRATE AND MANUFACTURING METHOD THEREOF, AND DISPLAY DEVICE

This is a National Phase Application filed under 35 U.S.C. 371 as a national stage of PCT/CN2014/078505, filed May 27, 2014, an application claiming the benefit of Chinese Application No. 201310684773.1, filed Dec. 13, 2013, the content of each of which is hereby incorporated by reference in its entirety.

FIELD OF THE INVENTION

The present invention relates to the field of displays, and particularly to a pixel unit, an array substrate including the pixel unit, a manufacturing method of the array substrate and a display device including the array substrate.

BACKGROUND OF THE INVENTION

With the development of the thin film transistor technology, the display technology based on low-temperature polycrystalline silicon gradually becomes a mainstream. FIG. 1 shows a typical pixel unit including a low-temperature polycrystalline silicon thin film transistor. The process of forming the pixel unit as shown in FIG. 1 includes the following steps: forming a buffer layer 40 on a substrate 70; forming an active layer 12 made of a low-temperature polycrystalline silicon material; forming a gate insulating layer 50; forming a gate (including a first gate 14 and a second gate 15); forming an interlayer insulating layer 55; forming a source via and a drain via; forming a source 11, a drain 13, a source via electrode 1 filling the source via and a drain via electrode 2 filling the drain via; forming a planarization layer 60; forming a planarization layer via; forming a common electrode 30 and a planarization layer via electrode 3 filling the planarization layer via; forming a passivation layer 80; forming a passivation layer via; and, forming pixel electrodes 20 and a passivation layer via electrode 4 filling the passivation layer via.

It can be seen that it is required to use masks 9-10 times for forming the pixel unit as shown in FIG. 1, and the process is relatively complicated. As a result, the manufacturing method of an array substrate including the pixel unit is complicated and high in cost.

Therefore, how to simplify a manufacturing method of an array substrate including a pixel unit becomes a technical problem to be solved in the art.

SUMMARY OF THE INVENTION

An object of the present invention is to provide a pixel unit, an array substrate including the pixel unit, a manufacturing method of the array substrate and a display device including the array substrate. Compared with the prior art, the manufacturing method of an array substrate including the pixel unit provided by the present invention is relatively simple.

To achieve the above object, as one aspect of the present invention, a pixel unit is provided, including a thin film transistor, a pixel electrode and a common electrode, wherein the common electrode and the pixel electrode form a capacitor, and the pixel electrode is integrated with a drain of the thin film transistor.

Preferably, a material of an active layer of the thin film transistor includes low-temperature polycrystalline silicon; the pixel unit further includes a buffer layer, and a first via and a second via penetrating through the buffer layer, wherein the buffer layer covers a source of the thin film transistor, the drain of the thin film transistor and the pixel electrode, the active layer of the thin film transistor is located above the buffer layer, the source of the thin film transistor is connected to the active layer of the thin film transistor through the first via, the pixel electrode is connected to the active layer of the thin film transistor through the second via.

Preferably, the pixel unit further includes a gate insulating layer which covers the active layer, and a gate of the thin film transistor is formed on the gate insulating layer.

Preferably, the gate of the thin film transistor includes a first gate and a second gate spaced apart.

Preferably, the pixel unit further includes a planarization layer located above the gate, and the common electrode is arranged on the planarization layer.

Preferably, the first via includes a first left via and a first right via, wherein the first left via is located above the source of the thin film transistor and penetrates through the buffer layer, the gate insulating layer and the planarization layer, while the first right via is located above the active layer of the thin film transistor and penetrates through the gate insulating layer and the planarization layer; and, the pixel unit further includes a first electrode, a material of the first electrode is the same as that of the common electrode, the first electrode comprises a first left electrode filled in the first left via, a first right electrode filled in the first right via and a first connection electrode for connecting the first left electrode to the first right electrode, and the first connection electrode is located above the planarization layer.

Preferably, the second via includes a second left via and a second right via, wherein the second left via is located above the active layer of the thin film transistor and penetrates through the gate insulating layer and the planarization layer, while the second right via is located above the pixel electrode and penetrates through the buffer layer, the gate insulating layer and the planarization layer; and, the pixel unit further includes a second electrode, the material of the second electrode is the same as that of the common electrode, the second electrode comprises a second left electrode filled in the second left via, a second right electrode filled in the second right via and a second connection electrode for connecting the second left electrode to the second right electrode, and the second connection electrode is located above the planarization layer.

As another aspect of the present invention, an array substrate is provided, including gate lines and data lines, wherein the gate lines and data lines on the array substrate are interlaced with each other to divide the array substrate into a plurality of pixel regions, each of the pixel regions is provided therein with a pixel unit, and wherein the pixel unit is the pixel unit provided by the present invention; and, within each of the pixel regions, the source of the thin film transistor is electrically connected to the corresponding data line, while the gate thereof is electrically connected to the corresponding gate line.

Preferably, within each of the pixel regions, at least a portion of the data line forms the source of the thin film transistor, while at least a portion of the gate line forms the gate of the thin film transistor.

Preferably, the active layer of the thin film transistor includes a first active region and a second active region spaced apart, both the first active region and the second active region are located beneath the corresponding gate lines; and, the gate of the thin film transistor includes a first gate and a second gate spaced apart, a portion of the gate line facing the first active region forms the first gate of the thin film transistor, and a portion of the gate line facing the second active region forms the second gate of the thin film transistor.

As still another aspect of the present invention, a manufacturing method of an array substrate is provided, including the following steps:

forming a pattern including a plurality of data lines and the source of a thin film transistor;

integrally forming a pattern including the drain of the thin film transistor and a pixel electrode;

forming a pattern including a plurality of gate lines and the gate of the thin film transistor, wherein the plurality of gate lines are interlaced with the plurality of data lines, so as to divide the array substrate into a plurality of pixel regions; and forming a pattern including a common electrode.

Preferably, a material of the thin film transistor includes low-temperature polycrystalline silicon, and the manufacturing method further includes the following steps:

forming a buffer layer above the pattern including the pixel electrode and the pattern including the source of the thin film transistor, so that the active layer of the thin film transistor is located above the buffer layer; and forming a first via and a second via penetrating through the buffer layer, so that the source of the thin film transistor is connected to the active layer of the thin film transistor through the first via, and the pixel electrode is connected to the active layer of the thin film transistor through the second via.

Preferably, the manufacturing method further includes the following steps implemented between the step of forming the active layer and the step of forming the common electrode:

forming a gate insulating layer above the active layer, so that the gate of the thin film transistor is located above the gate insulating layer; and forming a planarization layer above the gate, so that the common electrode is located on the planarization layer.

Preferably, the first via includes a first left via and a first right via, the second via includes a second left via and a second right via, and the step of forming the first via and the second via includes:

forming a first left via and a second right via penetrating through the buffer layer, the gate insulating layer and the planarization layer, wherein the first left via is located above the source of the thin film transistor and exposes a portion of an upper surface of the source, while the second right via is located above the drain and exposes a portion of an upper surface of the drain; and forming a first right via and a second left via penetrating through the gate insulating layer and the planarization layer, wherein both the first right via and the second left via are located above the active layer of the thin film transistor and expose a portion of an upper surface of the active layer.

While forming the common electrode, the first left via, the first right via, the second left via and the second right via are filled to form a first electrode and a second electrode, wherein the first electrode includes a first left electrode located in the first left via, a first right electrode located in the first right via and a first connection electrode for connecting the first left electrode to the first right electrode, the second electrode includes a second left electrode located in the second left via, a second right electrode located in the second right via and a second connection electrode for connecting the second left electrode to the second right electrode.

Preferably, the common electrode, the first electrode and the second electrode may be formed from the same conducting material.

As yet another aspect of the present invention, a display device is provided, including the array substrate provided by the present invention.

In the pixel unit provided by the present invention, since the pixel electrode is integrated with the drain of the thin film transistor, it is not required to provide connection vias, so the step of manufacturing vias used for the connection between the drain of the thin film transistor and the pixel electrode is omitted during manufacturing an array substrate including the pixel electrode, so that at least one patterning process is eliminated. Compared with a conventional patterning process using masks, during manufacturing an array substrate including the pixel unit provided by the present invention, the use of masks is reduced at least once, and the manufacturing cost of an array substrate including the pixel unit is thus reduced.

BRIEF DESCRIPTION OF THE DRAWINGS

The accompanying drawings are used for providing the further understanding of the present invention, and constitute a part of the specification. The accompanying drawings are used for explaining the present invention together with the following embodiments, but are not intended to limit the present invention. In the drawings.

REFERENCE NUMERALS

11—Source; 12—Active layer; 13—Drain; 14—First gate; 15—Second gate; 16—First electrode; 17—Second electrode; 20—Pixel electrode; 30—Common electrode; 40—Buffer layer; 50—Gate insulating layer; 60—Planarization layer; 70—Substrate; 80—Passivation layer; 90—gate line; 100—Data line; 12a—First active region; 12b—Second active region; 16a—First left electrode; 16b—First right electrode; 16c—First connection electrode; 17a—Second left electrode; 17b—Second right electrode; 17c—Second connection electrode; 16a'—First left via; 16b'—First right via; 17a'—Second left via; 17b'—Second right via; 1—Source via electrode; 2—Drain via electrode; 3—Planarization layer via electrode; and, 4—Passivation layer via electrode.

DETAILED DESCRIPTION OF THE EMBODIMENTS

The embodiments of the present invention will be described as below in details with reference to the accompanying drawings. It should be understood that, the embodiments described herein are merely used for describing and explaining the present invention, but are not intended to limit the present invention.

Figure 1:
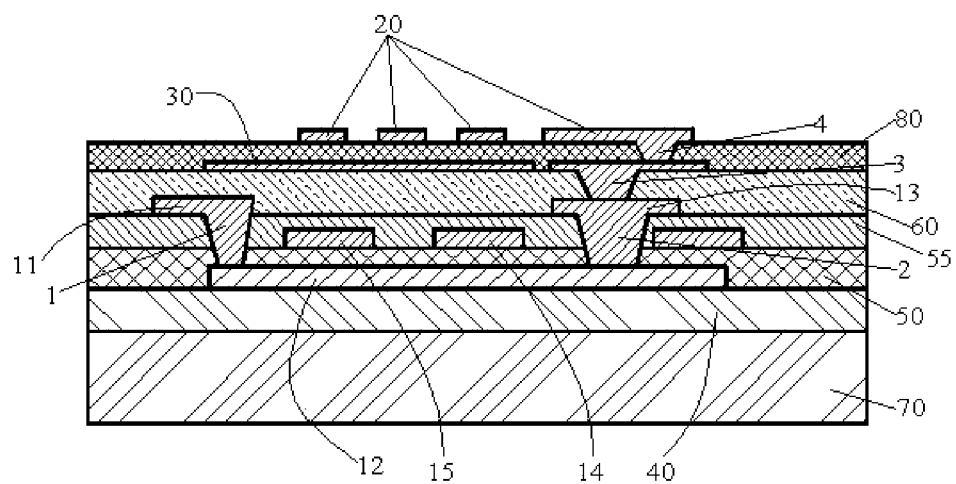
FIG. 1 is a schematic diagram of an existing pixel unit including a low-temperature polycrystalline silicon thin film transistor.
Figure 2:
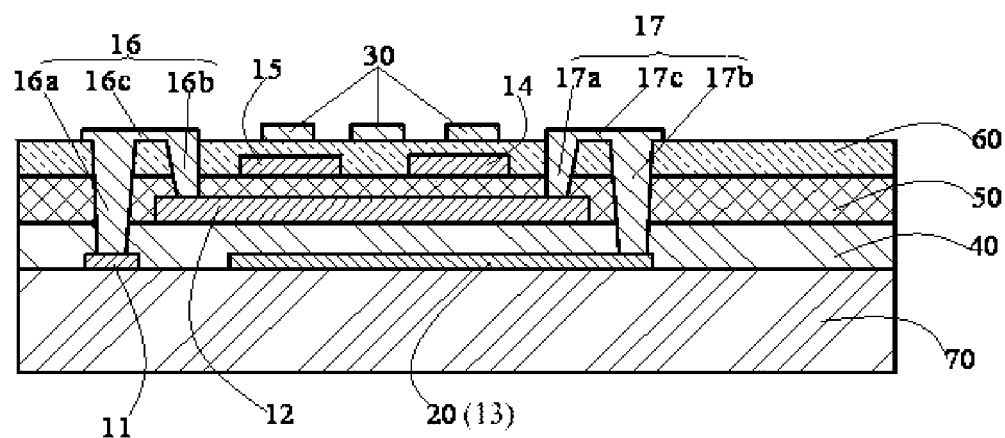
FIG. 2 is a sectional view of a pixel unit according to an embodiment of the present invention.
Figure 3:
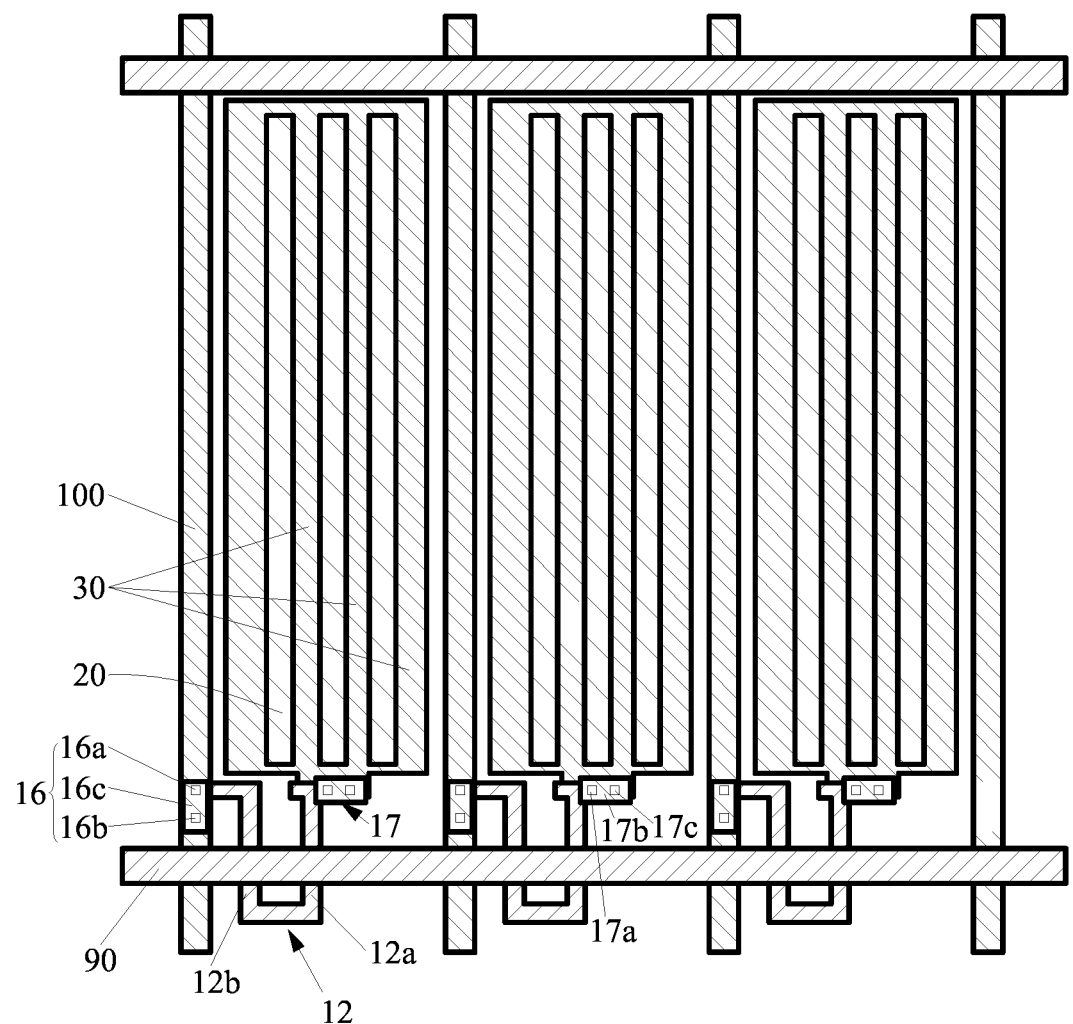
FIG. 3 is a top view of an array substrate according to an embodiment of the present invention.

As shown in FIG. 2 and FIG. 3, as one aspect of the present invention, a pixel unit is provided, including a thin film transistor, a pixel electrode 20 and a common electrode(s) 30. The common electrode 30 and the pixel electrode 20 form a capacitor, wherein the pixel electrode 20 is integrated with a drain 13 of the thin film transistor. In other words, the drain 13 of the thin film transistor is an extension portion of the pixel electrode 20 (for convenience, the pixel electrode 20 and the drain 13 in FIG. 2 are marked together).

In the case that the pixel electrode 20 is integrated with the drain 13 of the thin film transistor, it is not required to provide a via for allowing the pixel electrode 20 to be connected to the drain 13 of the thin film transistor. Therefore, during manufacturing an array substrate including the pixel electrode, the manufacturing of the vias for allowing the drain 13 of the thin film transistor to be connected to the pixel electrode 20 is omitted, so that at least one patterning process is eliminated. In comparison to a conventional patterning process using masks, during manufacturing an array substrate including the pixel unit provided by the present invention, the use of masks is reduced at least once, and the manufacturing cost of an array substrate including the pixel unit is thus reduced.

Those skilled in the art should easily understand that, the pixel electrode 20/drain 13 may be made from a transparent electrode material (for example, ITO). As the source of the thin film transistor mainly functions to receive current signals from data lines on an array substrate, the source of the thin film transistor may be made from a metal material having excellent conductivity. That is, the pixel electrode 20/drain 13 and the source 11 of the thin film transistor may be formed by two patterning processes, respectively.

In the present invention, the material of the active layer 12 of the thin film transistor is not specifically limited. For example, the material of the active layer 12 of the thin film transistor may include low-temperature polycrystalline silicon. In the present invention, the low-temperature polycrystalline silicon may be slightly doped to form the active layer 12 of the thin film transistor. In order to prevent metal ions from diffusing into the active layer 12 of the thin film transistor, preferably, the pixel unit may further include a buffer layer 40. The buffer layer 40 covers the source 11 of the thin film transistor, the pixel electrode 20 and the drain 13 of the thin film transistor integrated with the pixel electrode 20. The active layer 12 of the thin film transistor is located above the buffer layer 40. A first via and a second via may be formed by penetrating through the buffer layer 40. In this case, the source 11 of the thin film transistor is connected to the active layer 12 of the thin film transistor through the first via, and the pixel electrode 20/drain 13 is connected to the active layer 12 of the thin film transistor through the second via. More specifically, the pixel electrode 20 is connected to the active layer 12 through the drain 13 integrated therewith and the second via connected to the drain 13. It should be understood that, in an array substrate including the pixel unit, the buffer layer 40 may cover the whole substrate 70 of the array substrate. "The source 11 of the thin film transistor is connected to the active layer 12 of the thin film transistor through the first via" described herein refers that the condition of allowing the source of the thin film transistor to be connected to the active layer of the thin film transistor is formed by the arrangement of the first via, and the source 11 is electrically connected to the active layer 12 by metal or other conducting materials filled in the first via. The meaning of the sentence "the pixel electrode 20/drain 13 is connected to the active layer 12 of the thin film transistor through the second via" is similar to the explanation of the first via, and will not be repeated here.

In this embodiment, as both the pixel electrode 20 and the source 11 of the thin film transistor are arranged beneath the buffer layer 40, the buffer layer 40 may also serve as a protective layer of the pixel electrode 20. Meanwhile, as it is not required to specially provide a passivation layer for separating the pixel electrode 20 from the common electrode 30, in comparison to the structure of the pixel unit in the prior art, the pixel unit provided by the present invention is simpler in structure.

It should be easily understood that, as shown in FIG. 2, the source 11 of the thin film transistor and the integration of the drain 13 of the thin film transistor and the pixel electrode 20 may be directly formed on the substrate 70 of the array substrate. When the structure of the array substrate is applied to a liquid crystal display device, the substrate 70 is made from a light transmitting material. For example, the substrate 70 may be a glass substrate or a plastic light transmitting substrate. When the structure of the array substrate is applied to an OLED display device, in a top transmission mode, the substrate 70 may be made from a lightproof material; while in a bottom transmission mode, the substrate 70 may be made from a light transmitting material. For example, the substrate 70 may be a glass substrate or a plastic light transmitting substrate In order to separate the active layer 12 of the thin film transistor from the gate of the thin film transistor, the pixel unit further includes a gate insulating layer 50 covering the active layer 12, and the gate of the thin film transistor is formed on the gate insulating layer 50. The material of the gate insulating layer is known in the art, and will not be repeated here.

In order to reduce the leak current of the thin film transistor, as shown in FIG. 2, the gate of the thin film transistor may include a first gate 14 and a second gate 15 spaced apart. Designing the active layer 12 of the thin film transistor into a proper shape may be convenient to form the first gate 14 and the second gate 15, and the details will be described as below.

In the present invention, as the pixel electrode 20 is directly formed on the substrate 70, the common electrode 30 should be located rightly above the pixel electrode 20 so as to form a capacitor together with the pixel electrode 20. To be convenient for the arrangement of the common electrode 30, the pixel unit may further include a planarization layer 60 covering the gate, and the common electrode 30 is arranged on the planarization layer 60. It should be understood that the planarization layer 60 may cover the whole substrate 70 of the array substrate.

As described above, the source 11 of the thin film transistor is connected to the active layer 12 of the thin film transistor through the first via, and the pixel electrode 20/drain 13 is connected to the active layer 12 of the thin film transistor through the second via. In the present invention, the specific shapes and manufacturing methods of the first via and the second via are not specifically limited. For example, in a preferred embodiment, after the buffer layer 40 is formed, the first via and the second via penetrating through the buffer layer may be formed at proper positions above the buffer layer to expose a portion of the respective upper surfaces of the source 11, the active layer 12 and the drain 13, and then the conducting material is deposited to fill up the first via and the second via. In other words, the pixel unit may include a first electrode 16 filling the first via and a second electrode 17 filling the second via.

In order to reduce the steps of forming an array substrate including the pixel unit, preferably, the material of filling the first via (i.e., the material of the first electrode 16) is the same as the material of the common electrode 30. That is, while depositing a film layer for forming the common electrode 30, the same material is deposited in the first via. Specifically, as shown in FIG. 4E, the first via may include a first left via 16a' and a first right via 16b'. The first left via 16a' is located above the source 11 of the thin film transistor and penetrates through the buffer layer 40, the gate insulating layer 50 and the planarization layer 60. The first right via 16b' is located above the active layer 12 of the thin film transistor and penetrates through the gate insulating layer 50 and the planarization layer 60. Correspondingly, the first electrode 16 may include a first left electrode 16a filled in the first left via, a first right electrode 16b filled in the first right via and a first connection electrode 16c for connecting the first left electrode 16a to the first right electrode 16b. The first connection electrode 16c is located above the planarization layer 60.

After the planarization layer 60 is formed, the first left via 16a' and the first right via 16b' may be formed by a patterning process. Subsequently, a material layer for forming the common electrode 30 is deposited, and then a pattern including the common electrode 30 and the first electrode 16 is formed by a patterning process.

It should be understood that the directional terms "left, right" used herein refer to "left, right" directions in FIG. 2, and are merely used for distinguishing two portions of the first via and the first electrode, respectively, but not intended to limit the first via and the first electrode.

The second via may be of a structure similar to the first via, and the material for filling the second via (i.e., the material of the second electrode 17) may also be the same as the material of the common electrode 30. Therefore, as shown in FIG. 4E, the second via includes a second left via 17a' and a second right via 17b'. The second left via 17a' is located above the active layer 12 of the thin film transistor, and penetrates through the gate insulating layer 50 and the planarization layer 60. The second right via 17b' is located above the drain (not shown in the figure) extended from the pixel electrode 20, and penetrates through the buffer layer 40, the gate insulating layer 50 and the planarization layer 60 to expose a portion of the upper surface of the drain. Correspondingly, the second electrode may include a second left electrode 17a filled in the second left via, a second right electrode 17b filled in the second right via and a second connection electrode 17c for connecting the second left electrode 17a to the second right electrode 17b. The second connection electrode 17c is located above the planarization layer 60. Therefore, the active layer 12 is connected to the drain through the second left electrode 17a, the second connection electrode 17c and the second right electrode 17b so as to be connected to the pixel electrode 20 integrated with the drain.

Similarly, it should be understood that the directional terms "left, right" used herein refer to "left, right" directions in FIG. 2. The first via and the second via may be formed in the same patterning process, and the first electrode 16, the common electrode 30 and the second electrode 17 may also be formed in the same patterning process.

As another aspect of the present invention, as shown in FIG. 3, an array substrate is provided, including gate lines 90, data lines 100 and the pixel unit according to the present invention. The gate lines 90 and data lines 100 of the array substrate are interlaced with each other to divide the array substrate into a plurality of pixel regions. Each of the pixel regions is provided therein with the pixel unit. Within each of the pixel regions, the source of the thin film transistor is electrically connected to the corresponding data line 100, while the gate thereof is electrically connected to the corresponding gate line 90.

It can be seen from the above that, in the case that the pixel unit in the array substrate is the pixel unit provided by the present invention, during manufacturing an array substrate, the number of use of masks may be reduced, and the production cost may be thus lowered.

For example, during manufacturing an array substrate including the pixel unit as shown in FIG. 2, it is required to use masks 6 times for patterning. In comparison to the use of masks 9 times for patterning in the prior art, the manufacturing process is simpler.

In the pixel unit provided by the present invention, the thin film transistor may include a first gate and a second gate spaced apart. The above structure may be realized by arranging the first gate and the second gate on the gate line 90.

To simplify the structure of a mask, preferably, as shown in FIG. 3, within each of the pixel regions, at least a portion of the data line 100 forms the source of the thin film transistor, and at least a portion of the gate line 90 forms the gate of the thin film transistor.

When the at least a portion of the gate line 90 forms the gate of the thin film transistor, designing the active layer 12 into a proper shape may be convenient for the subsequent formation of the first gate and the second gate. Specifically, the active layer 12 of the thin film transistor may include a first active region 12a and a second active region 12b which are spaced apart, and both the first active region 12a and the second active region 12b are located beneath the corresponding gate lines 90. A portion of the gate line 90 of the array substrate facing the first active region 12a forms the first gate of the thin film transistor, and a portion of the gate line 90 of the array substrate facing the second active region 12b forms the second gate of the thin film transistor.

Figure 4A:
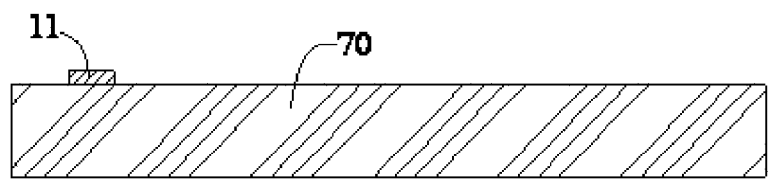
FIGS. 4A-4F are schematic diagrams of a manufacturing flow of an array substrate including the pixel unit as shown in FIG. 2.
Figure 4B:
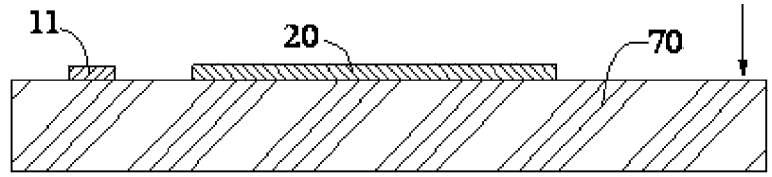
Figure 4C:
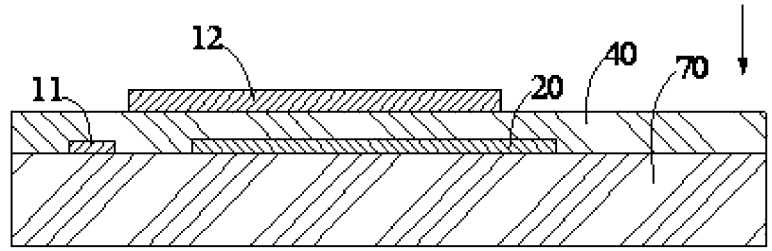
Figure 4D:
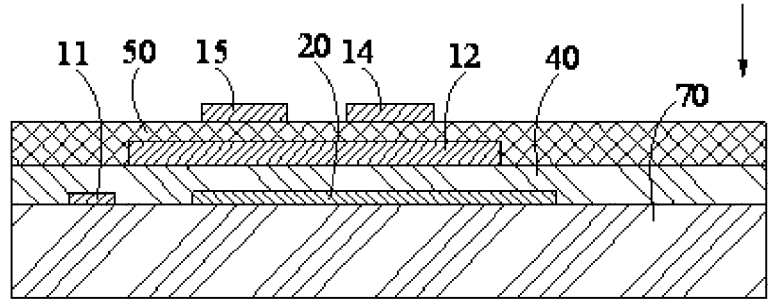
Figure 4E:
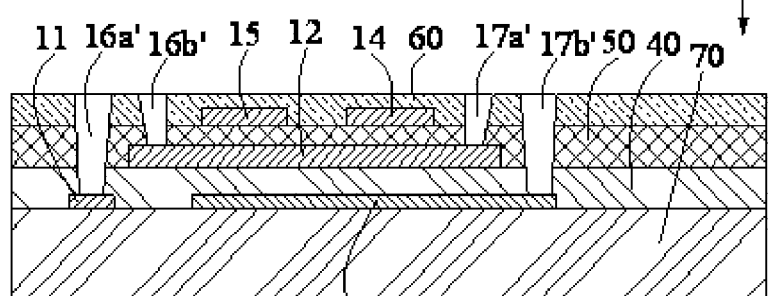
Figure 4F:
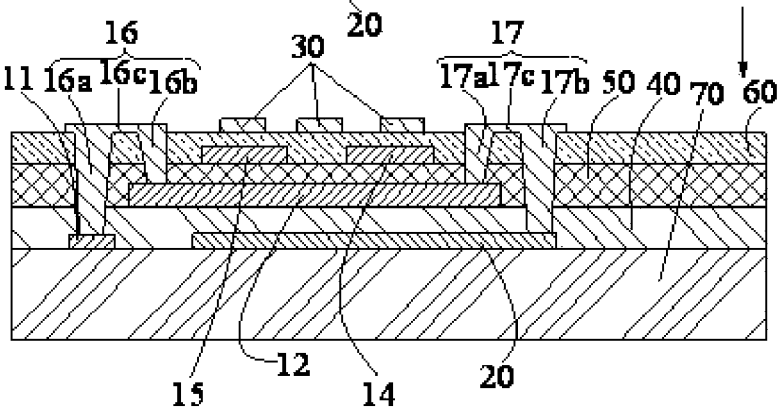

As another aspect of the present invention, a manufacturing method of the array substrate is provided. For convenience, in FIGS. 4A-4F, only the pixel electrode 20 is marked. As shown in FIGS. 4A-4F, the manufacturing method includes the following steps:

forming a pattern including a plurality of data lines and the source 11 of the thin film transistor, as shown in FIG. 4A;

integrally forming a pattern including the drain of the thin film transistor and a pixel electrode 20, as shown in FIG. 4B;

forming a pattern including a plurality of gate lines and the gate of the thin film transistor, wherein the plurality of gate lines are interlaced with the plurality of data lines, so as to divide the array substrate into a plurality of pixel regions, as shown in FIG. 4D; and forming a pattern including common electrode 30, as shown in FIG. 4F. It is easily understood that in the array substrate, the common electrode 30 and the pixel electrode 20 form a capacitor.

The forming a pattern including a plurality of data lines and the source 11 of the thin film transistor may be realized by a conventional patterning process, or may also be realized by printing, spraying or other processes.

During forming a plurality of data lines and the source of the thin film transistor by a conventional patterning process, a metal thin film may be formed on a glass substrate by deposition, coating, sputtering or other ways, and then the pattern including the plurality of data lines and the source of the thin film transistor is formed by a patterning process, as shown in FIG. 4A. Wherein, the patterning process includes photoresist coating, exposing, developing, etching, photoresist stripping, etc.

The steps of forming the pixel electrode, the plurality of gate lines, the gate of the thin film transistor and the common electrode are similar to the step of forming the data lines and the source of the thin film transistor, and will not be repeated redundantly here.

As described above, as the pixel electrode 20 is integrated with the drain of the thin film transistor, no via is required for the connection, so one patterning process is omitted during manufacturing the array substrate, and the manufacturing process of the array substrate becomes simpler.

It should be easily understood that the array substrate includes a substrate 70, so the source 11 of the thin film transistor may be directly formed on the substrate 70, as shown in FIG. 4A.

In the present invention, the type of the thin film transistor is not limited. When the material of the thin film transistor includes low-temperature polycrystalline silicon, the manufacturing method further includes the following steps:

forming a buffer layer 40 above the pattern including the pixel electrode and the pattern including the source 11 of the thin film transistor (it should be understood that the buffer layer covers the substrate 70 of the array substrate), so that the active layer 12 of the thin film transistor is located above the buffer layer 40 (as shown in FIG. 4C); and forming a first via and a second via penetrating through the buffer layer 40, so that the source 11 of the thin film transistor is connected to the active layer 12 of the thin film transistor through the first via, and the pixel electrode 20 is connected to the active layer 12 of the thin film transistor through the second via.

As described above, after the buffer layer 40 is formed, the active layer 12 of the thin film transistor may be formed on the buffer layer 40 by a patterning process. In the subsequent process, the first via and the second via are formed at proper positions above the buffer layer to expose a portion of the respective upper surfaces of the source 11, the active layer 12 and the drain extended from the pixel electrode 20. Then, a conducting material is deposited to fill up the first via and the second via, so that the source 11 is electrically connected to the active layer and the active layer 12 is electrically connected to the pixel electrode 20.

In order to separate the active layer 12 of the thin film transistor from the gate of the thin film transistor, the manufacturing method further includes the following steps (the steps are implemented between the step of forming the active layer 12 and the step of forming the common electrode 30):

forming a gate insulating layer 50 above the active layer 12, so that the gate of the thin film transistor is located above the gate insulating layer 50, as shown in FIG. 4D; and forming a planarization layer 60 above the gate, so that the common electrode 30 is located on the planarization layer 60, as shown in FIG. 4E.

To simplify the manufacturing process and reduce the number of masks used during manufacturing the array substrate, preferably, the first via includes a first left via 16a' and a first right via 16b', the second via includes a second left via 17a' and a second right via 17b', and the step of forming the first via and the second via includes:

forming the first left via 16a' and the second right via 17b' penetrating through the buffer layer 40, the gate insulating layer 50 and the planarization layer 60, wherein the first left via 16a' is located above the source 11 of the thin film transistor and exposes a portion of the upper surface of the source 11, while the second right via 17b' is located above the drain extended from the pixel electrode 20 and exposes a portion of the upper surface of the drain; and forming the first right via 16b' and the second left via 17a' penetrating through the gate insulating layer 50 and the planarization layer 60, wherein both the first right via 16b' and the second left via 17a' are located above the active layer 12 of the thin film transistor and expose a portion of the upper surface of the active layer 12, as shown in FIG. 4E.

In the above case, while forming the common electrode 30, the first left via 16a', the first right via 16b', the second left via 17a' and the second right via 17b' may be filled to form a first electrode 16 and a second electrode 17. The first electrode 16 includes a first left electrode 16a located in the first left via, a first right electrode 16b located in the first right via and a first connection electrode 16c for connecting the first left electrode 16a to the first right electrode 16b. The second electrode 17 includes a second left electrode 17a located in the second left via, a second right electrode 17b located in the second right via and a second connection electrode 17c for connecting the second left electrode 17a to the second right electrode 17b. The common electrode 30, the first electrode 16 and the second electrode 17 may be formed in one process by using the same conducting material.

Forming the first via and the second via in a same step (i.e., forming the first left via 16a', the first right via 16b', the second left via 17a' and the second right via 17b' in a same step) may reduce the number of use of masks; meanwhile, forming the common electrode 30, the first electrode 16 and the second electrode 17 in a same step may further reduce the number of use of masks, so that the manufacturing process of the array substrate becomes simpler.

It should be understood that, by controlling an etching ratio or the structure of masks, the first left via 16a' and the second right via 17b' may be allowed to penetrate through the buffer layer 40, the gate insulating layer 50 and the planarization layer 60, while the first right via 16b' and the second left via 17a' may be allowed to penetrate through only the gate insulating layer 50 and the planarization layer 60. For example, a mask may be designed in such a way: the light transmission of a portion corresponding to the first left via 16a' and the second right via 17b' is larger than that of a portion corresponding to the first right via 16b' and the second left via 17a'.

Or, the first left via 16a' and the second right via 17b' may be formed in one step, while the first right via 16b' and the second left via 17a' may be formed in another step. In this case, the order of the two steps is not limited.

As another aspect of the present invention, a display device is provided, including the array substrate according to the present invention. The display device provided by the present invention may be applied in a mobile phone, a computer display and a tablet computer.

Further, the display device may further include a color film substrate arranged opposing to the array substrate.

It should be understood that, the foregoing implementations are exemplary implementations used for describing the principle of the present invention, but the present invention is not limited thereto. A person of ordinary skill in the art may make various variations and improvements without departing from the spirit and essence of the present invention, and these variations and improvements are also deemed as falling into the protection scope of the present invention.

The invention claimed is:

1. A pixel unit, comprising a thin film transistor, a pixel electrode and a common electrode, wherein the common electrode and the pixel electrode forming a capacitor, and the pixel electrode is integrated with a drain of the thin film transistor, wherein the pixel unit further comprises a buffer layer, and a first via and a second via penetrating through the buffer layer, wherein the buffer layer covers a source of the thin film transistor, the drain of the thin film transistor and the pixel electrode, the active layer of the thin film transistor is located above the buffer layer, the source of the thin film transistor is connected to the active layer of the thin film transistor through the first via, and the pixel electrode is connected to the active layer of the thin film transistor through the second via.

2. The pixel unit according to claim 1, wherein a material of an active layer of the thin film transistor comprises low-temperature polycrystalline silicon.

3. The pixel unit according to claim 2, wherein the pixel unit further comprises a gate insulating layer which covers the active layer, and a gate of the thin film transistor is formed on the gate insulating layer.

4. The pixel unit according to claim 3, wherein the gate of the thin film transistor comprises a first gate and a second gate spaced apart.

5. The pixel unit according to claim 3, wherein the pixel unit further comprises a planarization layer located above the gate, and the common electrode is arranged on the planarization layer.

6. The pixel unit according to claim 5, wherein the first via comprises a first left via and a first right via, wherein the first left via is located above the source of the thin film transistor and penetrates through the buffer layer, the gate insulating layer and the planarization layer, while the first right via is located above the active layer of the thin film transistor and penetrates through the gate insulating layer and the planarization layer; and the pixel unit further comprises a first electrode, wherein a material of the first electrode is the same as that of the common electrode, the first electrode comprises a first left electrode filled in the first left via, a first right electrode filled in the first right via and a first connection electrode for connecting the first left electrode to the first right electrode, and the first connection electrode is located above the planarization layer.

7. The pixel unit according to claim 5, wherein the second via comprises a second left via and a second right via, wherein the second left via is located above the active layer of the thin film transistor and penetrates through the gate insulating layer and the planarization layer, while the second right via is located above the pixel electrode and penetrates through the buffer layer, the gate insulating layer and the planarization layer; and the pixel unit further comprises a second electrode, the material of the second electrode is the same as that of the common electrode, the second electrode comprises a second left electrode filled in the second left via, a second right electrode filled in the second right via and a second connection electrode for connecting the second left electrode to the second right electrode, and the second connection electrode is located above the planarization layer.

8. A display device, comprising an array substrate, wherein the array substrate comprises gate lines and data lines, the gate lines and data lines on the array substrate are interlaced with each other to divide the array substrate into a plurality of pixel regions, each of the pixel regions is provided therein with a pixel unit, and wherein the pixel unit is the pixel unit according to claim 1; and, within each of the pixel regions, a source of the thin film transistor is electrically connected to the corresponding data line, while a gate thereof is electrically connected to the corresponding gate line.

9. A display device, comprising an array substrate, wherein the array substrate comprises gate lines and data lines, the gate lines and data lines on the array substrate are interlaced with each other to divide the array substrate into a plurality of pixel regions, each of the pixel regions is provided therein with a pixel unit, and wherein the pixel unit is the pixel unit according to claim 1; and, within each of the pixel regions, at least a portion of the data line forms the source of the thin film transistor, while at least a portion of the gate line forms the gate of the thin film transistor.

10. The display device according to claim 9, wherein an active layer of the thin film transistor comprises a first active region and a second active region spaced apart, both the first active region and the second active region are located beneath the corresponding gate lines; and, the gate of the thin film transistor comprises a first gate and a second gate spaced apart, a portion of the gate line facing the first active region forms the first gate of the thin film transistor, and a portion of the gate line facing the second active region forms the second gate of the thin film transistor.

11. The pixel unit according to claim 8, wherein a material of an active layer of the thin film transistor comprises low-temperature polycrystalline silicon.

12. The pixel unit according to claim 11, wherein the pixel unit further comprises a gate insulating layer which covers the active layer, and a gate of the thin film transistor is formed on the gate insulating layer.

13. The pixel unit according to claim 12, wherein the pixel unit further comprises a planarization layer located above the gate, and the common electrode is arranged on the planarization layer.

14. The pixel unit according to claim 13, wherein the first via comprises a first left via and a first right via, wherein the first left via is located above the source of the thin film transistor and penetrates through the buffer layer, the gate insulating layer and the planarization layer, while the first right via is located above the active layer of the thin film transistor and penetrates through the gate insulating layer and the planarization layer; and the pixel unit further comprises a first electrode, wherein a material of the first electrode is the same as that of the common electrode, the first electrode comprises a first left electrode filled in the first left via, a first right electrode filled in the first right via and a first connection electrode for connecting the first left electrode to the first right electrode, and the first connection electrode is located above the planarization layer.

15. The pixel unit according to claim 13, wherein the second via comprises a second left via and a second right via, wherein the second left via is located above the active layer of the thin film transistor and penetrates through the gate insulating layer and the planarization layer, while the second right via is located above the pixel electrode and penetrates through the buffer layer, the gate insulating layer and the planarization layer; and the pixel unit further comprises a second electrode, the material of the second electrode is the same as that of the common electrode, the second electrode comprises a second left electrode filled in the second left via, a second right electrode filled in the second right via and a second connection electrode for connecting the second left electrode to the second right electrode, and the second connection electrode is located above the planarization layer.

16. A manufacturing method of an array substrate, comprising the following steps:
    forming a pattern comprising a plurality of data lines and a source of a thin film transistor;
    integrally forming a pattern comprising a drain of the thin film transistor and a pixel electrode;
    forming a pattern comprising a plurality of gate lines and a gate of the thin film transistor, wherein the plurality of gate lines are interlaced with the plurality of data lines, so as to divide the array substrate into a plurality of pixel regions; and
    forming a pattern comprising common electrode.

17. The manufacturing method according to claim 16, wherein a material of an active layer of the thin film transistor comprises low-temperature polycrystalline silicon, and the manufacturing method further comprises the following steps:
    forming a buffer layer above the pattern comprising the pixel electrode and the pattern comprising the source of the thin film transistor, so that the active layer of the thin film transistor is located above the buffer layer; and
    forming a first via and a second via penetrating through the buffer layer, so that the source of the thin film transistor is connected to the active layer of the thin film transistor through the first via, and the pixel electrode is connected to the active layer of the thin film transistor through the second via.

18. The manufacturing method according to claim 17, further comprising the following steps implemented between the step of forming the active layer and the step of forming the common electrode:
    forming a gate insulating layer above the active layer, so that the gate of the thin film transistor is located above the gate insulating layer; and
    forming a planarization layer above the gate, so that the common electrode is located on the planarization layer.

19. The manufacturing method according to claim 18, wherein the first via comprises a first left via and a first right via, the second via comprises a second left via and a second right via, and the step of forming the first via and the second via comprises:
    forming a first left via and a second right via penetrating through the buffer layer, the gate insulating layer and the planarization layer, wherein the first left via is located above the source of the thin film transistor and exposes a portion of an upper surface of the source, while the second right via is located above the drain and exposes a portion of an upper surface of the drain; and
    forming a first right via and a second left via penetrating through the gate insulating layer and the planarization layer, wherein both the first right via and the second left via are located above the active layer of the thin film transistor and expose a portion of an upper surface of the active layer.

20. The manufacturing method according to claim 19, wherein, while forming the common electrode, the first left via, the first right via, the second left via and the second right via are filled to form a first electrode and a second electrode, wherein the first electrode comprises a first left electrode located in the first left via, a first right electrode located in the first right via and a first connection electrode for connecting the first left electrode to the first right electrode, the second electrode comprises a second left electrode located in the second left via, a second right electrode located in the second right via and a second connection electrode for connecting the second left electrode to the second right electrode.

* * * * *